(12) United States Patent
Okamoto

(10) Patent No.: US 7,868,412 B2
(45) Date of Patent: Jan. 11, 2011

(54) SEMICONDUCTOR DEVICE AND METHOD OF FABRICATING THE SAME

(75) Inventor: Shintaro Okamoto, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/253,289

(22) Filed: Oct. 17, 2008

(65) Prior Publication Data
US 2009/0121311 A1    May 14, 2009

(30) Foreign Application Priority Data
Oct. 18, 2007   (JP) .............................. 2007-270757

(51) Int. Cl.
  *H01L 21/70*  (2006.01)
  *H01L 21/76*  (2006.01)
(52) U.S. Cl. ................. 257/508; 257/499; 257/506; 438/400; 438/424; 438/430
(58) Field of Classification Search ............. 257/314, 257/315, 316, 369, 370, 510, 508; 438/186, 438/207, 262, 296, 422, 424, 430
See application file for complete search history.

(56) References Cited

U.S. PATENT DOCUMENTS

| | | | | |
|---|---|---|---|---|
| 4,589,193 A | * | 5/1986 | Goth et al. | 438/430 |
| 2003/0207527 A1 | * | 11/2003 | Mehrad et al. | 438/207 |
| 2004/0188678 A1 | * | 9/2004 | Wieczorek et al. | 257/48 |
| 2004/0232514 A1 | * | 11/2004 | Arai et al. | 257/510 |

FOREIGN PATENT DOCUMENTS

| JP | 05-251647 A | 9/1993 |
|---|---|---|
| JP | 09-213786 A | 8/1997 |
| JP | 2002-208642 A | 7/2002 |

* cited by examiner

*Primary Examiner*—Thanh V Pham
*Assistant Examiner*—Errol Fernandes
(74) *Attorney, Agent, or Firm*—Foley & Lardner LLP

(57) ABSTRACT

A semiconductor device according to an embodiment of the invention includes: a semiconductor substrate; a well, having a well contact connection region, formed in the semiconductor substrate; a transistor formed on the well; an isolation region formed between the transistor formed on the well, and the well contact connection region; and a silicide layer formed between a bottom surface of the isolation region, and the semiconductor substrate.

16 Claims, 11 Drawing Sheets

US 7,868,412 B2

SEMICONDUCTOR DEVICE AND METHOD OF FABRICATING THE SAME

CROSS-REFERENCE TO RELATED APPLICATIONS

This application is based upon and claims the benefit of priority from prior Japanese Patent Application No. 2007-270757, filed on Oct. 18, 2007, the entire contents of which are incorporated herein by reference.

BACKGROUND

A semiconductor device in which elements formed on a semiconductor substrate are isolated from one another by an isolation region for the purpose of realizing high integration of an integrated circuit device is known as a conventional semiconductor device. Also, a semiconductor device, in which an impurity layer is provided under isolation region to connect between wells having the same conductivity type with a low electric resistance thereby obtaining a common potential to the wells, is known as the semiconductor device having such isolation regions formed therein. This technique, for example, is described in Japanese Patent KOKAI No. H09-213786.

BRIEF SUMMARY

A semiconductor device according to one embodiment of the invention includes:
a semiconductor substrate;
a well, having a well contact connection region, formed in the semiconductor substrate;
a transistor formed on the well;
an isolation region formed between the transistor formed on the well, and the well contact connection region; and
a silicide layer formed between a bottom surface of the isolation region, and the semiconductor substrate.

A method of fabricating a semiconductor device according to another embodiment of the invention includes:
forming a trench in a region between an element region on a well and a well contact connection region in a semiconductor substrate, the semiconductor substrate comprising the well having the well contact connection region and the element region in which a transistor is intended to be formed on the well;
forming a silicide layer at least on a bottom surface of the trench; and
filling an insulating film in the trench after formation of the silicide layer, thereby forming an isolation region.

A method of fabricating a semiconductor device according to still another embodiment of the invention includes:
simultaneously forming first and second trenches in a region between a first element region on a first well and a first well contact connection region, and a region between a second element region on a second well and a second well contact connection region, respectively, in a semiconductor substrate, the semiconductor substrate comprising the first and second wells and the first and second element regions, the first and second wells having different conductivity types and having the first and second well contact connection regions, respectively, the first and second element regions being regions in which first and second transistors having different conductivity types are intended to be formed on the first and second wells, respectively;
simultaneously forming silicide layers on at least bottom surfaces of the first and second trenches, respectively; and
simultaneously filling insulating films in the first and second trenches after formation of the silicide layers, thereby forming isolation regions, respectively.

DETAILED DESCRIPTION

First Embodiment

Figure 1:
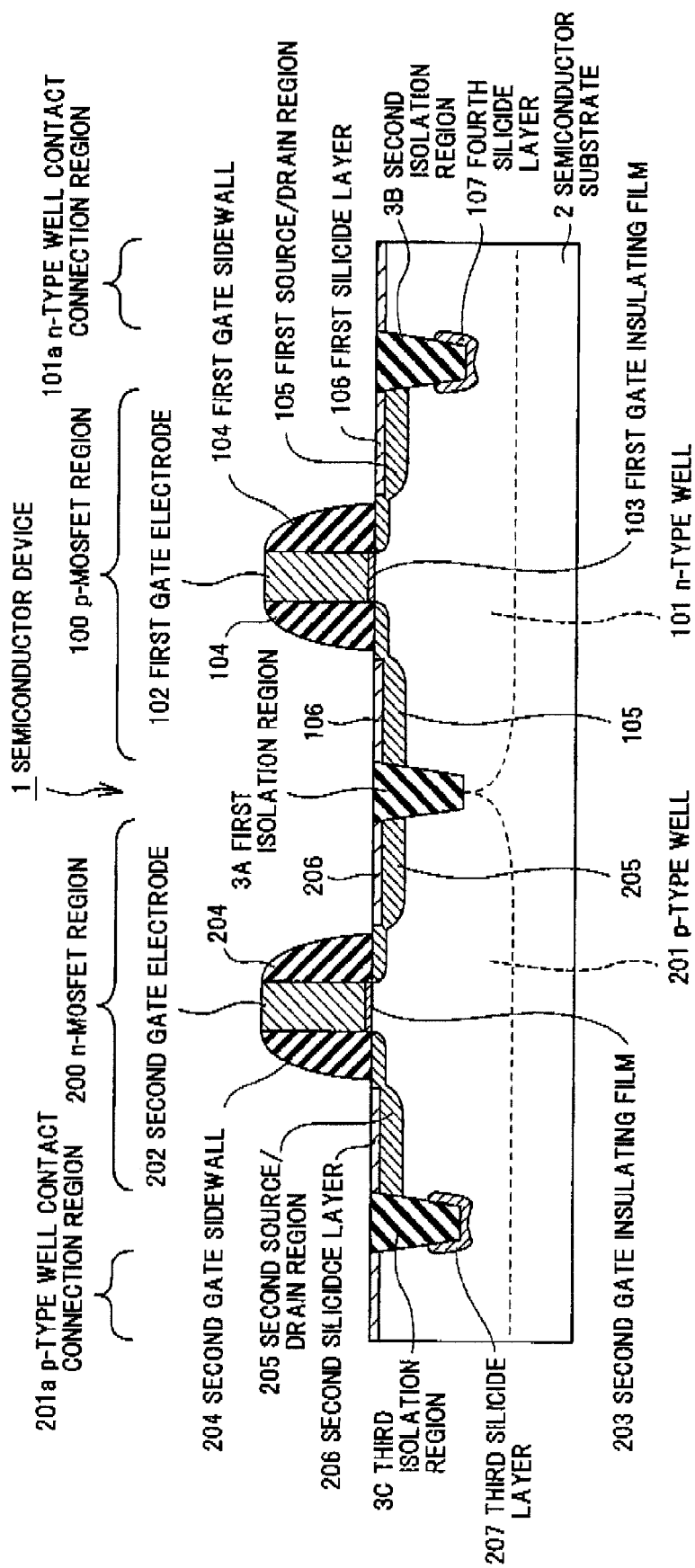
FIG. 1 is a cross sectional view of a semiconductor device according to a first embodiment.

FIG. 1 is a cross sectional view of a semiconductor device according to a first embodiment. The semiconductor device 1 includes a semiconductor substrate 2 made of single crystal Si or the like, and a p-MOSFET region 100 and an n-MOSFET region 200 as element regions formed on the semiconductor substrate 2. The p-MOSFET region 100 and the n-MOSFET region 200, for example, are isolated from each other by a first isolation region 3A, for example, having a Shallow Trench Isolation (STI) structure. In addition, the p-MOSFET region 100 and an n-type well contact connection region 101a are isolated from each other by a second isolation region 3B, for example, having the STI structure. Also, the n-MOSFET region 200 and a p-type well contact connection region 201a are isolated from each other by a third isolation region 3C, for example, having the STI structure.

The p-MOSFET region 100 includes an n-type well 101 formed in the semiconductor substrate 2, first source/drain regions 105 formed in the vicinities of a surface of the semiconductor substrate 2, respectively, first silicide layers 106 formed in the vicinities of the surfaces of the first source/drain regions 105, respectively, a first gate electrode 102 formed on the semiconductor substrate 2 through a first gate insulating film 103, and first gate sidewalls 104 formed on side surfaces of the first gate electrode 102, respectively.

The n-MOSFET region 200 includes a p-type well 201 formed in the semiconductor substrate 2, second source/drain regions 205 formed in the vicinities of the surface of the semiconductor substrate 2, respectively, second silicide layers 206 formed in the vicinities of the surfaces of the second source/drain regions 205, respectively, a second gate electrode 202 formed on the semiconductor substrate 2 through a second gate insulating film 203, and second gate sidewalls 204 formed on the side surfaces of the second gate electrode 202, respectively.

The first gate electrode 102 is made of a semiconductor crystal containing therein a predetermined conductivity type impurity. Specifically, the first gate electrode 102 can be made of a Si or Si system polycrystal such as SiGe. Ions of a p-type impurity such as B or $BF_2$ can be used as ones of an impurity of a p-type conductivity.

The second gate electrode 202 is made of a semiconductor crystal containing therein a predetermined conductivity type impurity. Specifically, the second gate electrode 202 can be made of a Si or Si system polycrystal such as SiGe. Ions of an n-type impurity such as As or P can be used as ones of an impurity of an n-type conductivity.

Each of the first and second gate insulating films 103 and 203, for example, is made of $SiO_2$, SiN, SiON or a High-k material (such as a Hf system material such as HfSiON, HfSiO or HfO, a Zr system material such as ZrSiON, ZrSiO or ZrO, or a Y system material such as $Y_2O_3$).

Each of the first and second gate sidewalls 104 and 204, for example, may have a single layer structure including an insulating material such as SiN, a two-layer structure including a plurality kind of insulating materials such as SiN, $SiO_2$ or Tetraethoxysilane (TEOS), or a three or more-layer structure.

Each of the first source/drain regions 105 is formed by implanting ions of an impurity of a p-type conductivity such as B, $BF_2$ or In into the surface of the semiconductor substrate 2.

Each of the second source/drain regions 205 is formed by implanting ions of an impurity of an n-type conductivity such as As or P into the surface of the semiconductor substrate 2.

Each of the first and second silicide layers 106 and 206 is made of a silicon compound containing therein a metal such as Ni, Pt, Co, Er, Pd or NiPt.

Each of the first, second and third isolation regions 3A, 3B and 3C is formed by filling an insulating film in a trench formed in the semiconductor substrate 2. The third and fourth silicide layers 107 and 207 are formed on lower surfaces and parts of lower side surfaces, of the second and third isolation regions 3B and 3C, as interfaces with the semiconductor substrate 2, respectively. Each of the third and fourth silicide layers 107 and 207 is made of a silicon compound containing therein a metal such as Ni, Pt, Co, Er, Pd or NiPt.

FIGS. 2A to 2G are respectively cross sectional views showing processes for fabricating the semiconductor device according to the first embodiment.

Figure 2A:
FIGS. 2A to 2G are respectively cross sectional views showing processes for fabricating the semiconductor device according to the first embodiment.

Firstly, as shown in FIG. 2A, a hard mask 4, for example, made of an oxide film formed of $SiO_2$, a nitride film formed of SiN, or the like is formed on the semiconductor substrate 2. The hard mask 4 having an etching selectivity against silicon, for example, is made of the oxide film formed of $SiO_2$, the nitride film formed of SiN, or the like, for example, the silicon nitride film.

Figure 2B:
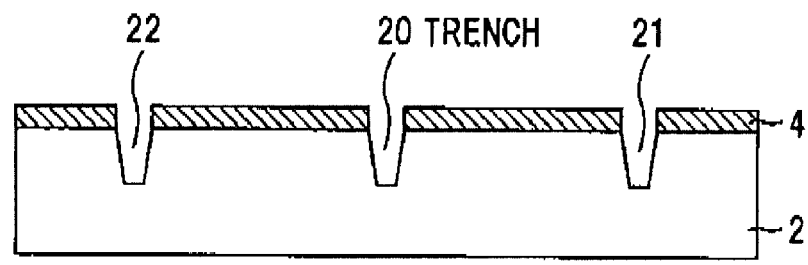

Next, as shown in FIG. 2B, patterning is performed to the hard mask 4 so as to form a predetermined pattern corresponding to portions which are intended to become the isolation regions using a lithography method. After that, trenches each having a depth of about 100 to about 500 nm are formed in the semiconductor substrate 2 by utilizing a Reactive Ion Etching (RIE) method or the like using the hard mask 4 having the predetermined pattern. A trench 20 for isolating the p-MOSFET region 100 and the n-MOSFET region 200 from each other, a trench 21 for isolating the p-MOSFET region 100 and the n-type well contact connection region 101a from each other, and a trench 22 for isolating the n-MOSFET region 200 and the p-type well contact connection region 201a from each other exist as the trenches formed by utilizing the RIE method or the like.

Figure 2C:
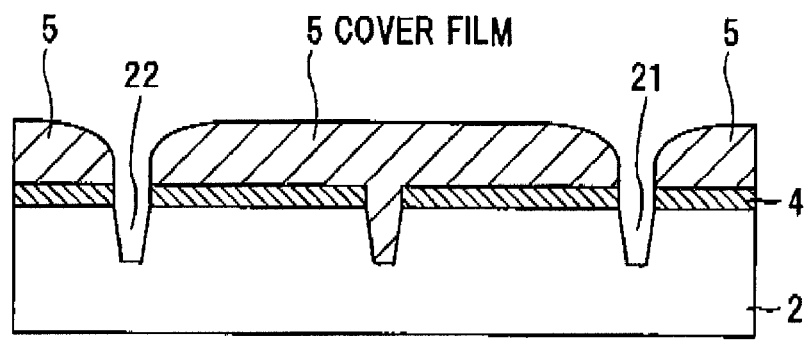

Next, as shown in FIG. 2C, a cover film 5 made of $SiO_2$ is deposited on the hard mask 4 and in the trenches 20, 21 and 22, and patterning is then performed to the cover film 5 so as to open the trenches 21 and 22 using a lithography method.

After that, the cover film 5 is partially etched. At this time, the trench 20 is kept filled with the cover film 5.

Figure 2D:
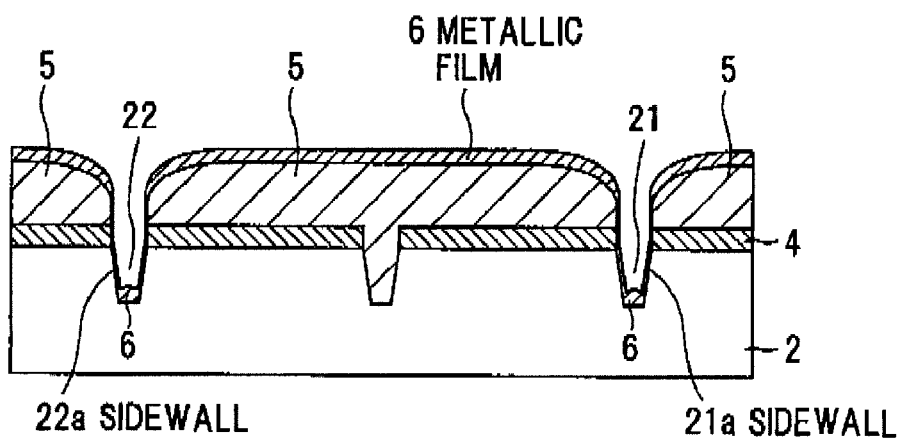

Next, as shown in FIG. 2D, a metallic film 6 made of Ni or the like is deposited so as to cover the cover film 5, the trench 21 and the trench 22 by utilizing a sputtering method or the like. As a result, the metallic film 6 having a thickness required for the silicidation is deposited on each of the bottom surfaces of the trenches 21 and 22. However, the metallic film 6 is also deposited on each of the lower side surfaces of sidewalls 21a and 22a of the trenches 21 and 22. At this time, the thickness of the metallic film 6 formed on each of the lower side surfaces of the sidewalls 21a and 22a of the trenches 21 and 22 is preferably smaller than that of the metallic film 6 deposited on each of the bottom surfaces of the trenches 21 and 22. From this viewpoint, the cover film 5 is formed to have the suitable thickness.

Figure 2E:
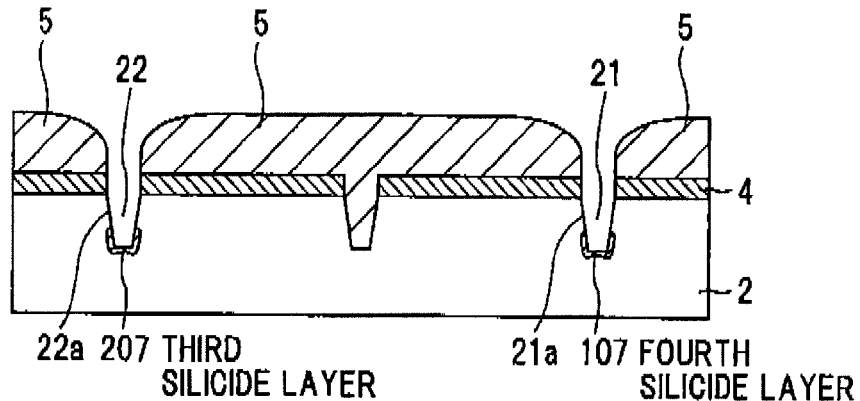

Next, as shown in FIG. 2E, Rapid Thermal Annealing (RTA) is performed for the semiconductor substrate 2 having the metallic film 6 deposited on the cover film 5, and the trenches 21 and 22, which results in that the third silicide layer 107 and the fourth layer 207 are simultaneously formed in portions from the bottom surfaces to the lower sides of the inner side surfaces of the trenches 21 and 22, respectively. Thus, the third silicide layer 107 and the fourth layer 207 are simultaneously formed in portions from the bottom surfaces to the lower sides of the inner side surfaces of the trenches 21 and 22, respectively, by a silicidation reaction occurring between the metallic film 6 deposited in the portions from the bottom surfaces to the lower sides of the inner side surfaces of the trenches 21 and 22, and Si of the semiconductor substrate 2. Here, when the entire inner side surfaces of the trenches 21 and 22 are silicidized, the short circuit occurs between the first and second source/drain regions 105 and 205, and the fourth and third silicide layers 107 and 207. In order to cope with this situation, it is preferable to obtain a shape of the trenches 21 and 22 that an aspect ratio as a ratio of a depth to a width of each of openings in the trenches 21 and 22 is made large, thereby making the metallic film 6 hard to be stuck to each of the sidewalls 21a and 22a of the trenches 21 and 22.

Figure 2F:
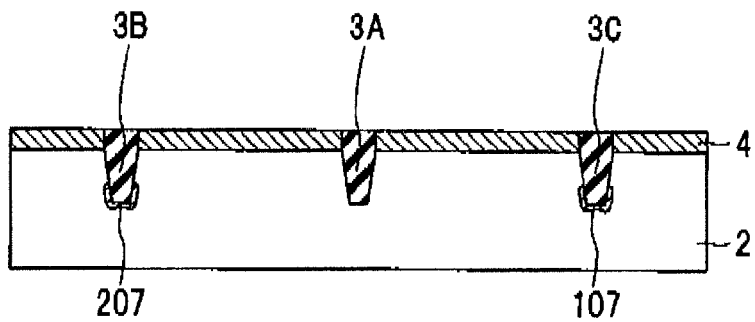

Next, as shown in FIG. 2F, the cover film 5 on the hard mask 4 and in the trench 20 is etched away by utilizing the RIE method or the like. Thereafter, an insulating film made of $SiO_2$ or the like is deposited on the hard mask 4, and in the trenches 20, 21 and 22 by utilizing a CVD method. Also, the insulating film is planarized so as to expose the hard mask 4 by utilizing a Chemical Mechanical Polishing (CMP) method or the like, thereby forming the first isolation region 3A, the second isolation region 3B, and the third isolation region 3C.

Figure 2G:
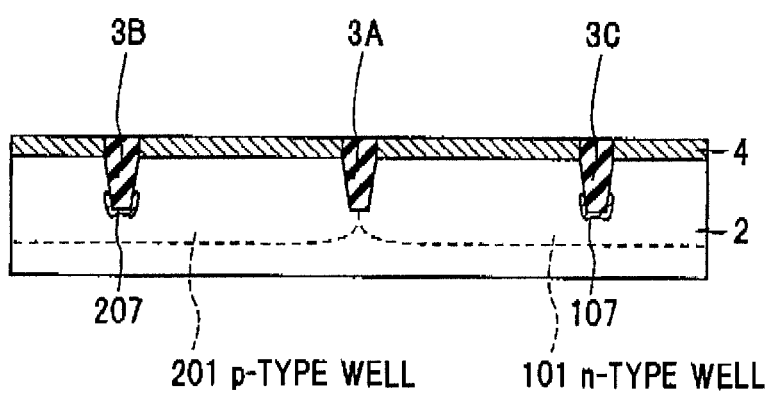

Next, as shown in FIG. 2G, ions of an n-type impurity such as As or P are implanted into a portion in which the n-type well is intended to be formed of the semiconductor substrate 2, thereby forming the n-type well 101. In addition, ions of a p-type impurity such as B or $BF_2$ are implanted into a portion in which the p-type well 201 is intended to be formed of the semiconductor substrate 2, thereby forming the p-type well 201. After that, although not illustrated, the p-MOSFET region 100 including the first gate insulating film 103, the first gate electrode 102, the first gate sidewalls 104, the first source/drain regions 105, and the like, and the n-MOSFET region 200 including the second gate insulating film 203, the second gate electrode 202, the second gate sidewalls 204, the second source/drain regions 205, and the like are formed, thereby fabricating the semiconductor device 1.

According to the semiconductor device 1 of the first embodiment, the third and fourth silicide layers 107 and 207 as the low resistance portions are provided in the interfaces between the semiconductor substrate 2 and the lower surfaces to the low side surfaces of the second and third isolation regions 3B and 3C, respectively. Therefore, the n-type well 101 and the n-type well contact connection region 101a in the lower portion of the p-MOSFET region 100 can be connected to each other with a low resistance, and p-type well 201 and the p-type well contact connection region 201a in the lower portion of the n-MOSFET region 200 can also be connected to each other with the low resistance. It is noted that the third and fourth silicide layers 107 and 207 are formed in a way that the portions thereof formed on the side surfaces of the second and third isolation regions 3B and 3C do not contact the first and second source/drain regions 105 and 205, respectively. In addition, the fabricating processes can be simplified because the fourth and third silicide layers 107 and 207 can be simultaneously formed, and thus need not to be formed separately from each other. Note that, no silicide layer is formed in an interface between the first isolation region 3A and the semiconductor substrate 2 in order to ensure the isolation and the well withstand voltage.

Second Embodiment

A second embodiment is different from the first embodiment in that a low resistance portion is formed by forming a high impurity concentration region and a silicide layer in a portion from a bottom surface to lower sides of inner side surfaces of an isolation region. It is noted that a description of the same respects as those in the first embodiment is omitted here for the sake of simplicity.

Figure 3:
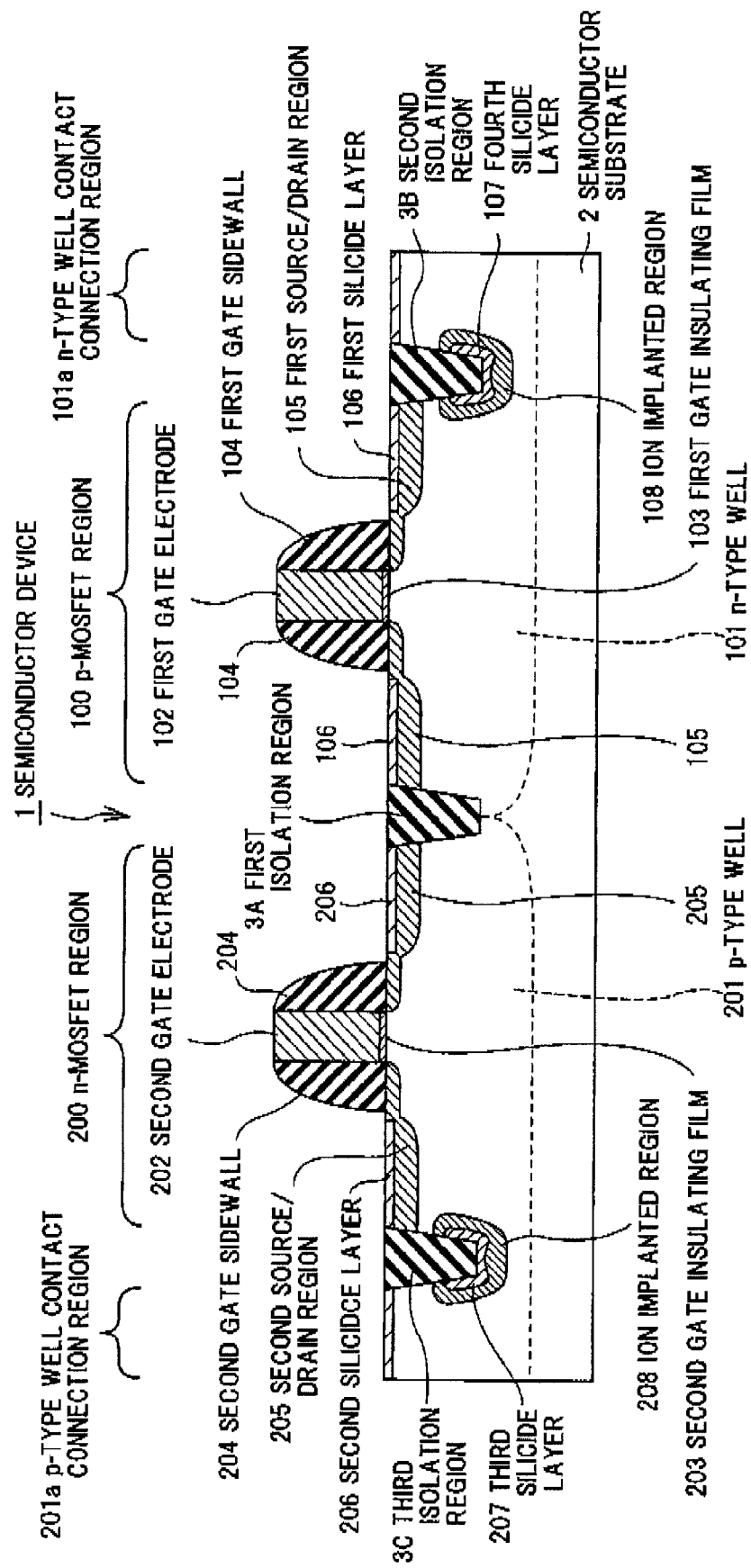
FIG. 3 is a cross sectional view of a semiconductor device according to a second embodiment.

FIG. 3 is a cross sectional view of a semiconductor device according to a second embodiment. The semiconductor device 1 of this embodiment includes ion implanted regions 108 and 208, and third and fourth isolation regions 107 and 207 as low resistance portions. The ion implanted regions 108 and 208 are regions as high impurity concentration regions which cover portions from bottom surfaces to lower sides of inner side surfaces of second and third isolation regions 3B and 3C. The third and fourth isolation regions 107 and 207 are formed as low resistance portions so as to contact the ion implanted regions 108 and 208, and the second and third isolation regions 3B and 3C, respectively.

Ions of a conductivity type impurity are implanted into the semiconductor substrate 2 by utilizing an ion implantation method or the like, thereby forming the ion implanted regions 108 and 208. Here, the ions of an impurity same as the impurity which are implanted into the semiconductor substrate 2 for formation of the n-type well 101 are implanted into a portion in which the ion implanted region 108 is intended to be formed at a higher concentration than that of the n-type well 101, thereby forming the ion implanted region 108. In addition, the ions of an impurity same as the impurity which are implanted into the semiconductor substrate 2 for formation of the p-type well 201 are implanted into a portion in which the ion implanted region 208 is intended to be formed at a higher concentration than that of the p-type well 201, thereby forming the ion implanted region 208.

Figure 4A:
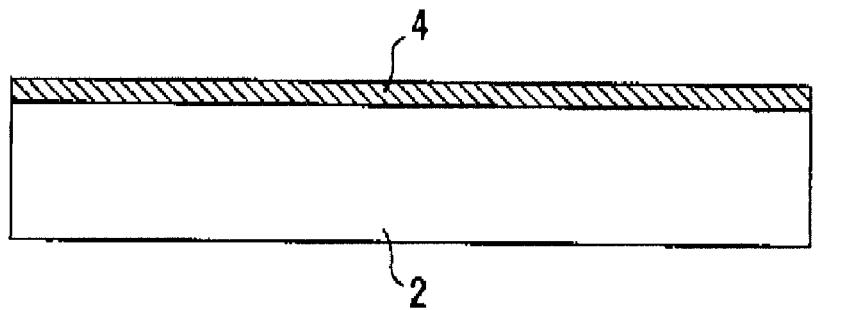
FIGS. 4A to 4J are respectively cross sectional views showing processes for fabricating the semiconductor device according to the second embodiment.
Figure 4B:
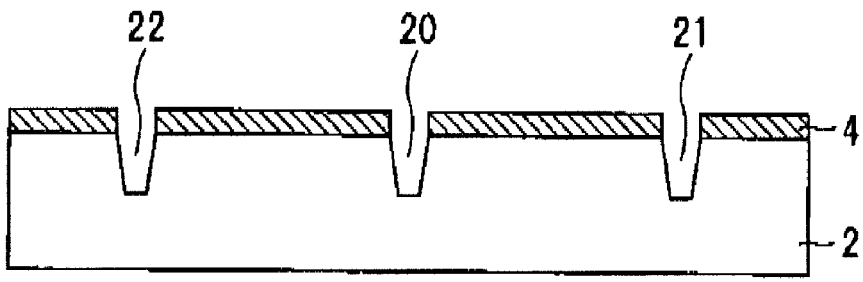

FIGS. 4A to 4J are respectively cross sectional views showing processes for fabricating the semiconductor device according to the second embodiment. It is noted that since the process for forming the hard mask 4 on the semiconductor substrate 2 shown in FIG. 4A, and the process for forming the trenches 20, 21 and 22 shown in FIG. 4B are the same as those in the first embodiment, a description thereof is omitted here for the sake of simplicity.

Figure 4C:
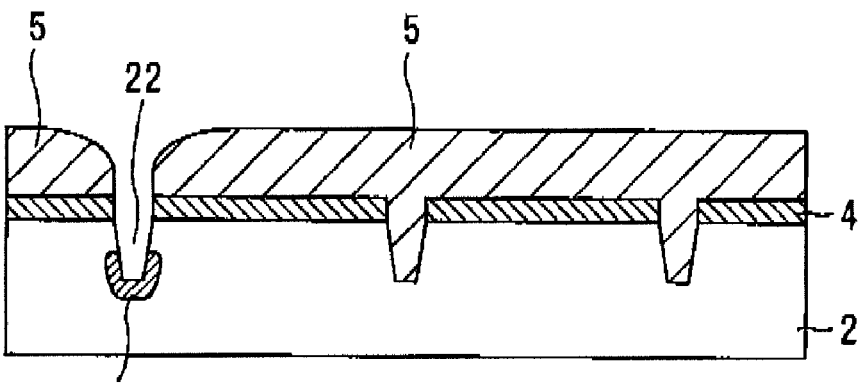

Next, as shown in FIG. 4C, the cover film 5 made of $SiO_2$ is deposited on the hard mask 4 and in the trenches 20, 21 and 22, and the patterning is performed to the cover film 5 so as to open the trench 22 using the lithography method. At this time, each of the trenches 20 and 21 is kept filled with the cover film 5. Next, ions of an impurity of a p-type conductivity are implanted into a portion from the bottom surface to the lower side of the inner side surfaces of the trench 22 of the semiconductor substrate 2, thereby forming the ion implanted region 208. At this time, the ion implanted region 208 is preferably formed in the portion from the bottom surface to the lower side of the sidewalls 22a of the trench 22 of the semiconductor substrate 2.

Figure 4D:
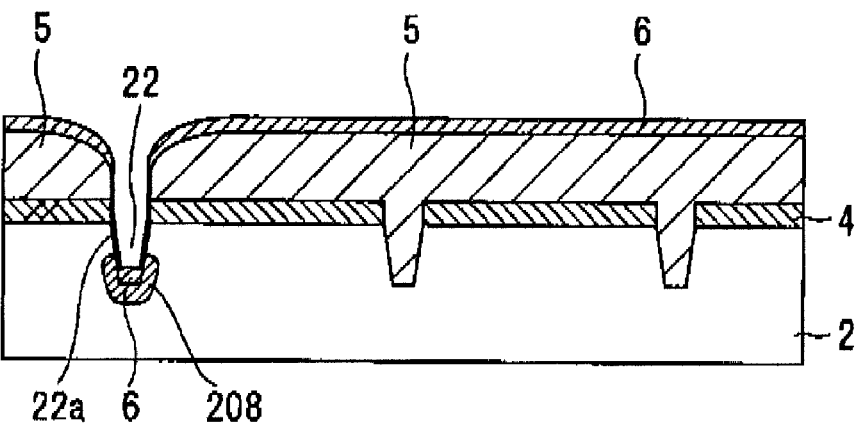

Next, as shown in FIG. 4D, the metallic film 6 made of Ni or the like is deposited so as to cover the cover film 5 and the trench 22 by utilizing the sputtering method or the like. As a result, the metallic film 6 is deposited on the portion from the bottom surface to the lower side of the inner side surface of the trench 22.

Figure 4E:
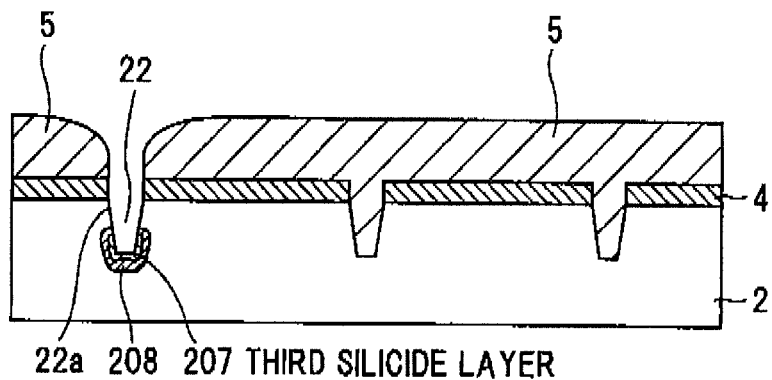

Next, as shown in FIG. 4E, the RTA is performed for the semiconductor substrate 2 having the metallic film 6 deposited on the cover film 5 and the trench 22, thereby forming the fourth silicide layer 207 in the portion, from the bottom surface to the lower side of the inner side surface of the trench 22, in which the ion implanted region 20 is formed. Next, the cover film 5 on the hard mask 4 is etched away by utilizing the RIE method or the like.

Figure 4F:
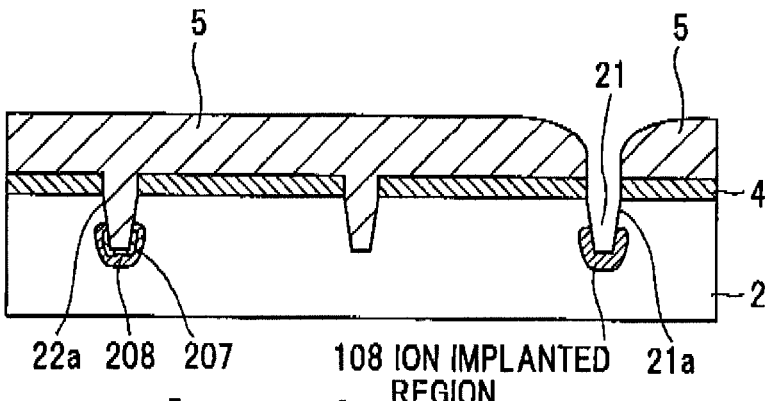

Next, as shown in FIG. 4F, another cover film 5 made of $SiO_2$ is deposited on the hard mask 4 and in the trenches 20, 21 and 22, and the patterning is performed to the another cover film 5 so as to open the trench 21 using the lithography method. At this time, each of the trenches 20 and 22 is kept filled with the cover film 5. Next, ions of an impurity of an n-type conductivity are implanted into a portion from the bottom surface to the lower side of the inner side surface of the trench 21 of the semiconductor substrate 2, thereby forming the ion implanted region 108. At this time, the ion implanted region 108 is preferably formed in the portion from the bottom surface to the sidewall 21a of the trench 21 similarly to the case of the ion implanted region 208.

Figure 4G:
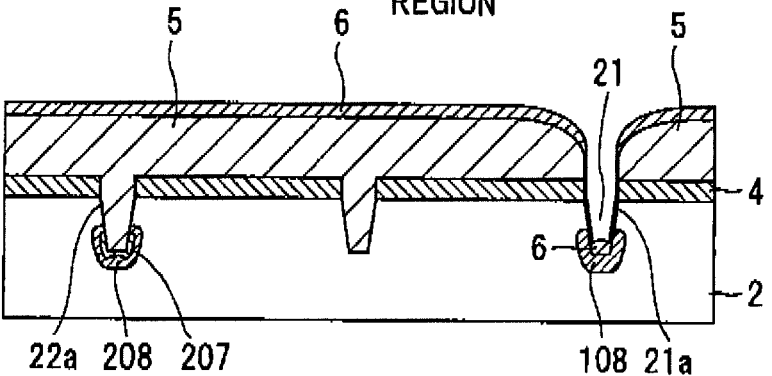

Next, as shown in FIG. 4G, the metallic film 6 made of Ni or the like is deposited so as to cover the another cover film 5 and the trench 21 by utilizing the sputtering method or the like. As a result, the metallic film 6 is deposited on a portion from the bottom surface to the lower side of the inner side surface of the trench 21.

Figure 4H:
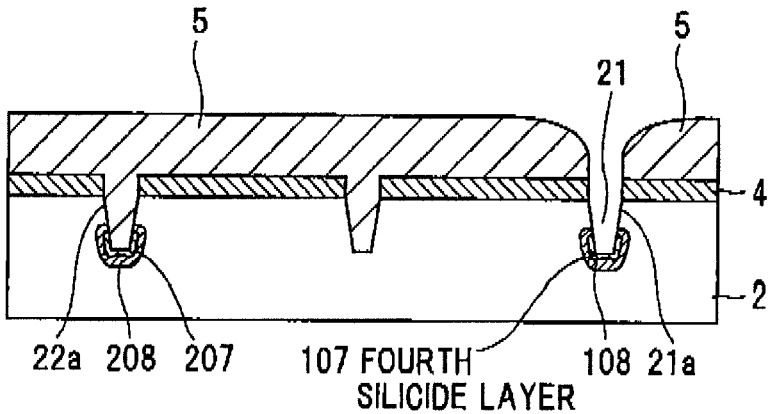

Next, as shown in FIG. 4H, the RTA is performed for the semiconductor substrate 2 having the metallic film 6 deposited on the another cover film 5 and the trench 21, which results in that the fourth silicide layer 107 is formed in a portion from the bottom surface to the lower side of the inner side surface of the trench 21 having the ion implanted region 108 formed therein. Next, the another cover film 5 on the hard mask 4 and in the trenches 20 and 22 is etched away by utilizing the RIE method or the like.

Figure 4I:
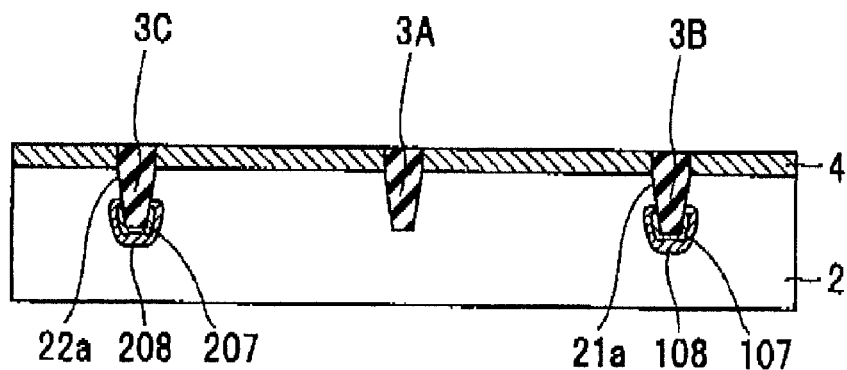

Next, as shown in FIG. 4I, the insulating film made of $SiO_2$ or the like is deposited on the hard mask 4 and in the trenches 20, 21 and 22 by utilizing the CVD method. Also, the insulating film is planarized so as to expose the hard mask 4, thereby forming the first isolation region 3A, the second isolation region 3B, and the third isolation region 3C.

Figure 4J:
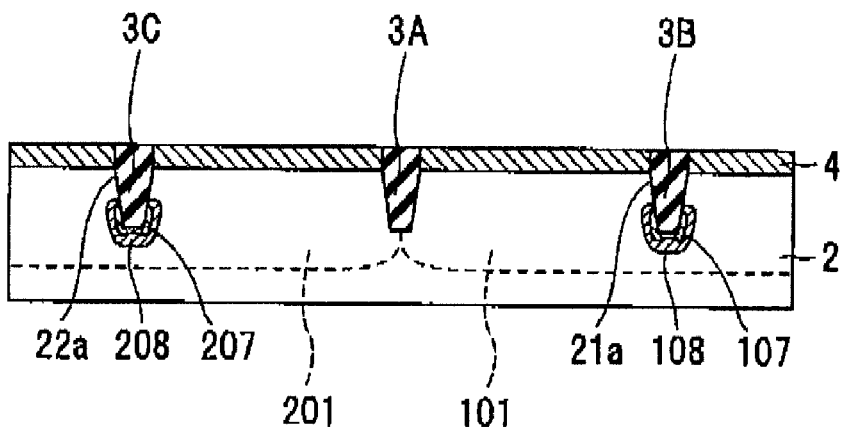

Next, as shown in FIG. 4J, the ions of an n-type impurity such as As or P are implanted into the portion in which the n-type well is intended to be formed of the semiconductor substrate 2, thereby forming the n-type well 101. In addition, the ions of a p-type impurity such as B or $BF_2$ are implanted into the portion in which the p-type well is intended to be formed of the semiconductor substrate 2, thereby forming the p-type well 201.

According to the semiconductor device 1 of the second embodiment, the low resistance portions, which is constituted by the ion implanted regions 108 and 208 each of which is obtained by implanting the n-type and p-type impurities at the higher concentrations than those of the n-type and p-type impurities contained in the n-type well 101 and the p-type well 201, respectively, and the third and fourth silicide layers 107 and 207, are provided in the portions from the bottom surfaces to the lower sides of the inner side surfaces of the second and third isolation regions 3a and 3C, respectively. Therefore, similarly to the case of the first embodiment, the n-type well 101 and the n-type well contact connection region 101a in the lower portion of the p-MOSFET region 100 can be connected to each other with the low resistance, and p-type well 201 and the p-type well contact connection region 201a in the lower portion of the n-MOSFET region 200 can also be connected to each other with the low resistance. Note that, no silicide layer is formed in an interface between the first isolation region 3A and the semiconductor substrate 2 in order to ensure the isolation and the well withstand voltage.

Third Embodiment

A third embodiment is different from the first embodiment in that barrier layers are formed on the inner side surfaces of the trenches 20, 21 and 22 which are formed when the first, second and third isolation regions 3A, 3B and 3C are formed in the semiconductor substrate 2.

Figure 5:
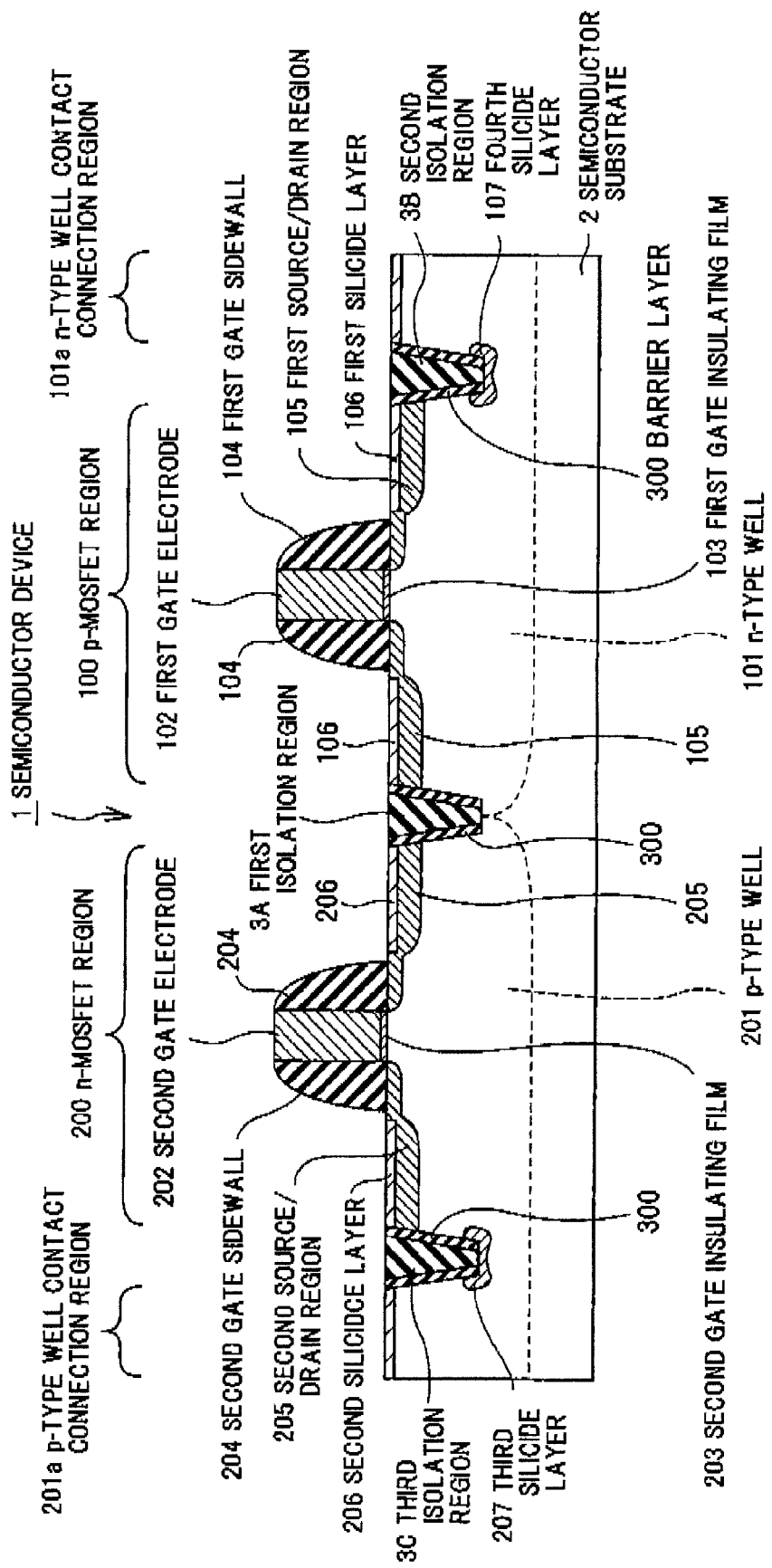
FIG. 5 is a cross sectional view of a semiconductor device according to a third embodiment.

FIG. 5 is a cross sectional view of a semiconductor device according to a third embodiment. The semiconductor device 1 of this embodiment includes barrier layers 300 which suppress the silicidation of the metallic films, and which are formed on the sidewalls of the first, second and third isolation regions 3A, 3B and 3C, respectively.

Each of the barrier layers 300, for example, is made of an oxide film formed of $SiO_2$, a nitride film formed of SiN, or the like by utilizing the CVD method or the like. In addition, each of the barrier layers 300 may also be made of an oxide film formed on an exposed portion of the semiconductor substrate 2 made of Si by performing a heat treatment for the semiconductor substrate 2.

FIGS. 6A to 6E are respectively cross sectional views showing processes for fabricating the semiconductor device according to the third embodiment.

Figure 6A:
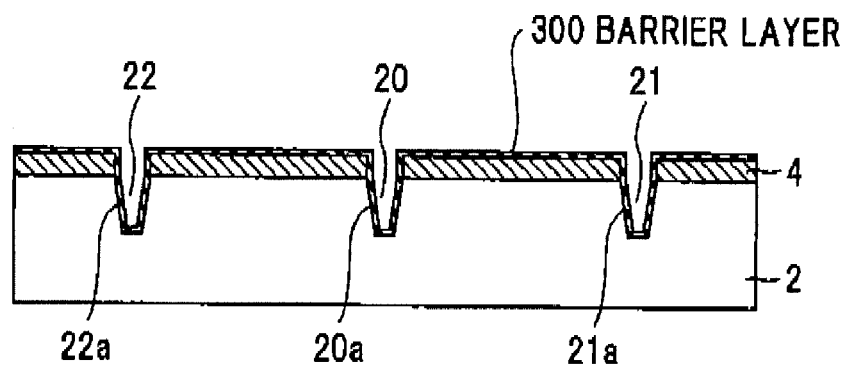
FIGS. 6A to 6E are respectively cross sectional views showing processes for fabricating the semiconductor device according to the third embodiment.

Firstly, as shown in FIG. 6A, there are performed the processes up to the formation of the trenches 20, 21 and 22 in the semiconductor substrate 2 having the hard mask 4 formed thereon shown in FIG. 2B of the first embodiment. Next, a $SiO_2$ film is deposited so as to cover the hard mask 4 and the trenches 20, 21 and 22 by utilizing the CVD method or the like, thereby forming a barrier layer 300.

Figure 6B:
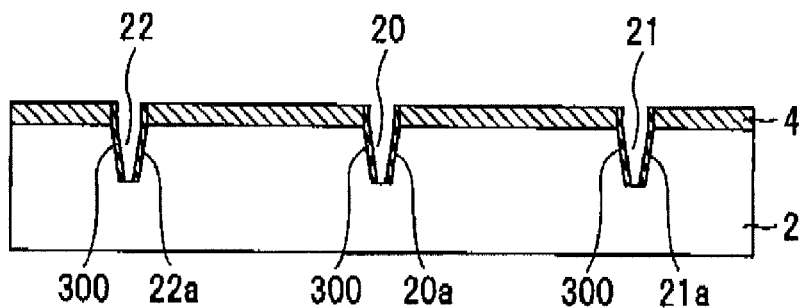

Next, as shown in FIG. 6B, the RIE or the like is performed for the semiconductor substrate 2 having the barrier layer 300 formed on its surface, thereby removing the barrier layer 300 other than the portions of the barrier layer 300 covering the sidewalls of the trenches 20, 21 and 22. As a result, portions of the semiconductor substrate 2 corresponding to the bottom surfaces of the trenches 20, 21 and 22, respectively, are exposed.

Figure 6C:
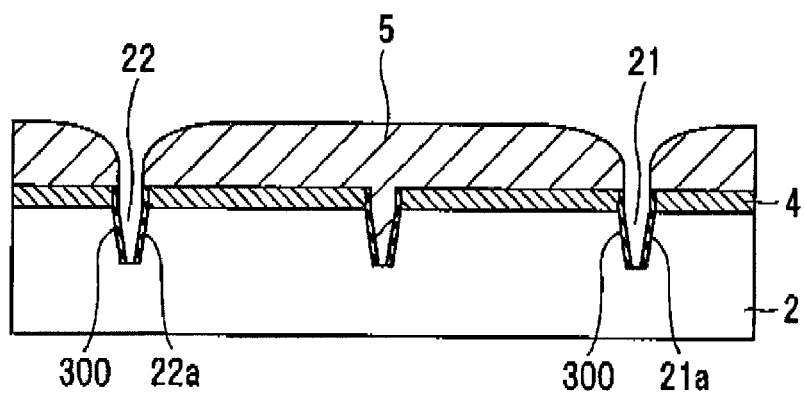

Next, as shown in FIG. 6C, the cover film 5 made of $SiO_2$ is deposited on the hard mask 4 and in the trenches 20, 21 and 22, and the patterning is performed to the cover film 5 so as to open the trenches 21 and 22 using the lithography method. At this time, each of the trenches 21 and 22 is in a state of having the barrier layer 300 formed on its sidewalls, and the portions of the semiconductor substrate 2 is in a state of being exposed from the bottom surfaces of the trenches 21 and 22, respectively. It is noted that the trench 20 is kept filled with the cover film 5.

Figure 6D:
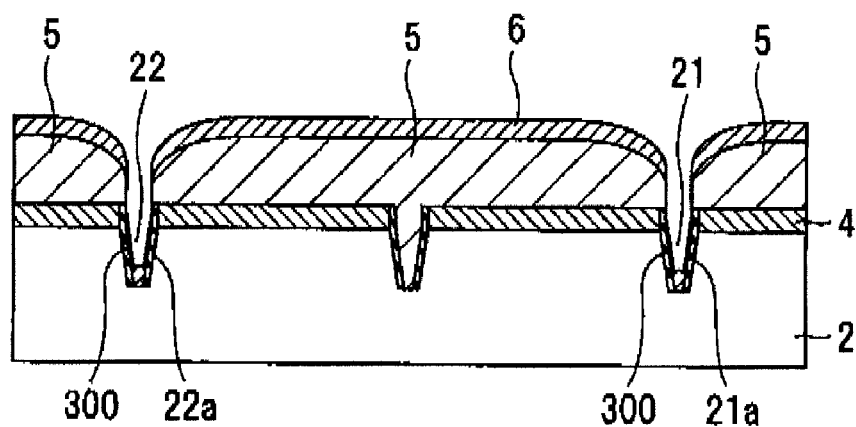

Next, as shown in FIG. 6D, the metallic film 6 made of Ni or the like is deposited so as to cover the cover film 5, and the trenches 21 and 22 by utilizing the sputtering method or the like. At this time, since the barrier layer 300 is formed on each of the sidewalls of the trenches 21 and 22, the metallic film 6 contacts each of the portions of the semiconductor substrate 2 in the bottom surfaces of the trenches 21 and 22.

Figure 6E:
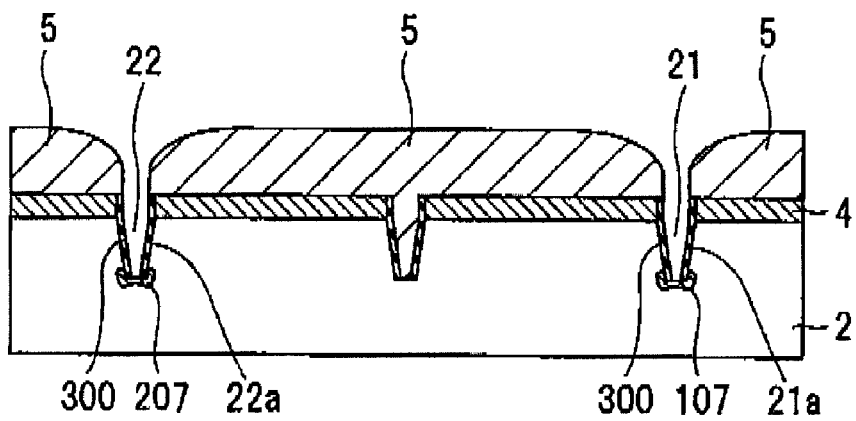

Next, as shown in FIG. 6E, the RTA is performed for the semiconductor substrate 2 having the metallic film 6 deposited on the cover film 5 and in the trenches 21 and 22, which results in that the silicide layers 107 and 207 are formed on the bottom surfaces of the trenches 21 and 22, respectively. Since the third and fourth silicide layers 107 and 207 are formed on the exposed portions of the semiconductor substrate 2 in the bottom surfaces of the trenches 21 and 22, respectively, they can extend merely slightly around to the side surface sides of the trenches 21 and 22, respectively.

According to the semiconductor device 1 of the third embodiment, due to the formation of the third and fourth silicide layers 107 and 207 previously described in the first embodiment, the n-type well 101 and the n-type well contact connection region 101a in the lower portion of the p-MOSFET region 100 can be connected to each other with the low resistance, and the p-type well 201 and the p-type well contact connection region 201a in the lower portion of the n-MOSFET region 200 can also be connected to each other with the low resistance. In addition thereto, it is possible to suppress that, each of the entire inner surfaces of the trenches 21 and 22 is uniformly silicidized, by the barrier layer 300. As a result, the semiconductor device 1 which is excellent in the reliability is obtained because the first source/drain region 105 and the second source/drain region 205 which are formed in the vicinities of the surface of the semiconductor substrate 2, respectively, are prevented from contacting the fourth and third silicide layers 107 and 207, respectively.

It is noted that although the barrier layer 300 is formed in order to prevent each of the third and fourth silicide layers 107 and 207 from being uniformly formed on the corresponding one of the entire inner surfaces of the side walls of the trenches 21 and 22 based on the silicidation with the metallic film 6 formed on each of the sidewalls of the trenches 21 and 22, respectively, any other suitable structure not relying on the structure having the barrier layer provided therein may also be adopted as long as it is possible to prevent the metallic film 6 from being formed on each of the sidewalls of the trenches 21 and 22.

Fourth Embodiment

A fourth embodiment is different from the third embodiment in that the third and fourth silicide layers 207 and 107 are formed in the portions from the bottom surfaces to the lower sides of the inner side surfaces of the trenches 21 and 22 without providing the barrier layer 300 described in the third embodiment.

FIGS. 7A to 7D are respectively cross sectional views showing processes for fabricating a semiconductor device according to a fourth embodiment.

Figure 7A:
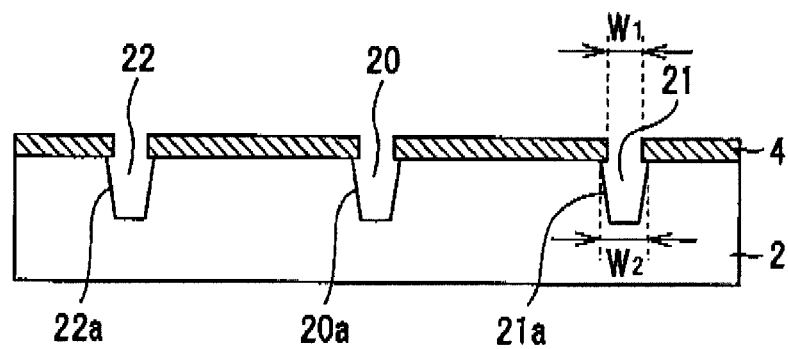
FIGS. 7A to 7D are respectively cross sectional views showing processes for fabricating a semiconductor device according to a fourth embodiment.

Firstly, as shown in FIG. 7A, there are performed the processes up to the formation of the trenches 20, 21 and 22 in the semiconductor substrate 2 having the hard mask 4 formed thereon. Next, isotropic etching such as wet etching is performed for the inner surfaces of the trenches 20, 21 and 22, thereby enlarging the trenches 20, 21 and 22 without increasing or decreasing a width of each of openings of the hard mask 4. As a result, a width and a depth of each of the trenches 20, 21 and 22 are each enlarged, and a width W2 of opening of each of the trenches 20, 21 and 22 is wider than a width W1 of each of openings of the hard mask 4.

Figure 7B:
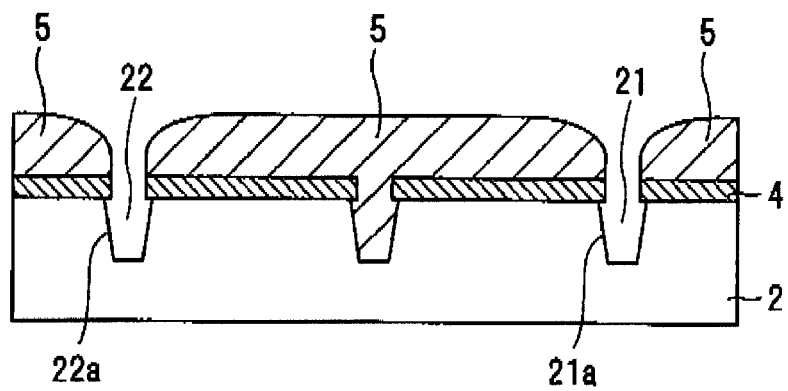

Next, as shown in FIG. 7B, the cover film 5 made of $SiO_2$ is deposited on the hard mask 4 and in the trenches 20, 21 and 22, and the patterning is performed to the cover film 5 so as to open the trenches 21 and 22 using the lithography method. At this time, each of upper portions of the inner side surfaces of the trenches 21 and 22 is kept covered with parts of the hard mask 4 and the cover film 5.

Figure 7C:
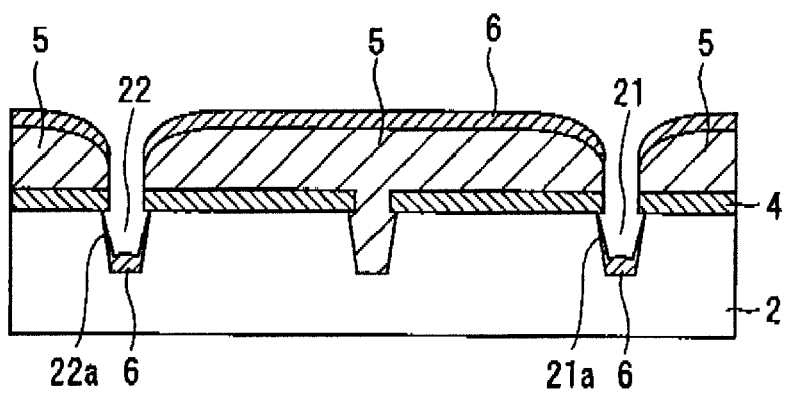

Next, as shown in FIG. 7C, the metallic film 6 made of Ni or the like is deposited so as to cover the cover film 5, and the trenches 21 and 22 by utilizing the sputtering method or the like. At this time, the metallic film 6 is mainly deposited on each of portions from the bottom surfaces to the lower sides of the inner side surfaces of the trenches 21 and 22 due to presence of the parts of the hard mask 4 and the cover film 5 covering the upper sides of the inner side surfaces of the trenches 21 and 22.

Figure 7D:
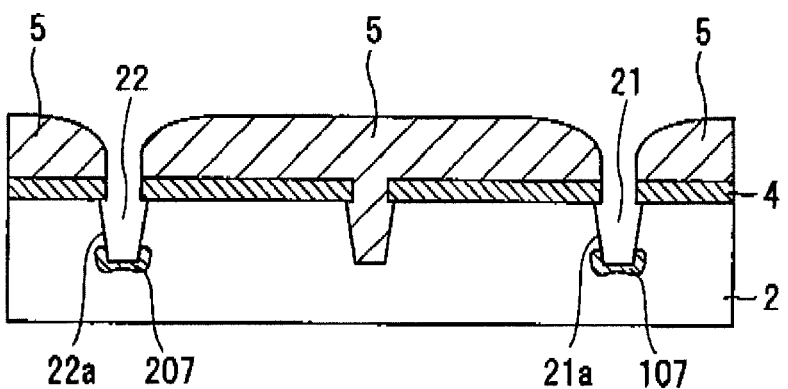

Next, as shown in FIG. 7D, the heat treatment such as the RTA is performed for the semiconductor substrate 2, which results in that the third and fourth silicide layers 207 and 107 are formed in each of the portions from the bottom surfaces to the lower sides of the inner side surfaces of the trenches 21 and 22 by the reaction occurring between the metallic film 6 deposited in each of the portions from the bottom surfaces to the lower sides of the inner side surfaces of the trenches 21 and 22, and Si of the semiconductor substrate 2.

According to the semiconductor device 1 of the fourth embodiment, each of the upper sides of the inner side surfaces of the trenches 21 and 22 is covered by the hard mask 4 after completion of the process for selectively etching the semiconductor substrate 2, which results in that the metallic film 6 can be efficiently deposited on each of the portions from the bottom surfaces to the lower sides of the inner side surfaces of the trenches 21 and 22. In addition, even when the barrier layer or the like is not formed, the third and fourth silicide layers 207 and 107 can be precisely formed in the portions from the bottom surfaces to the lower sides of the inner side surfaces of the trenches 22 and 21, respectively, which results in that the fabricating processes can be simplified, thereby suppressing the cost of fabricating.

The invention is by no means limited to the embodiments described above, and various changes can be made without departing from the gist of the invention.

In addition, the constituent elements of the embodiments described above can be arbitrarily combined with one another without departing from the gist of the invention.

What is claimed is:

1. A method of fabricating a semiconductor device, comprising:
simultaneously forming first, second and third trenches in a region between a first element region on a first well and a first well contact connection region, and a region between a second element region on a second well and a second well contact connection region, and a region between the first element region and the second element region, respectively, in a semiconductor substrate, the semiconductor substrate comprising the first and second wells and the first and second element regions, the first and second wells having different conductivity types and having the first and second well contact connection regions, respectively, the first and second element regions being regions in which first and second transistors having different conductivity types are intended to be formed on the first and second wells, respectively;
simultaneously forming silicide layer on bottom surfaces of the first and second trenches; and
simultaneously filling insulating films in the first, second and third trenches after formation of the silicide layers, thereby forming isolation regions, respectively, wherein the silicide layers are formed on only the bottom surfaces of the first and second trenches among the bottom surfaces of the first and second trenches and a bottom surface of the third trench.

2. The method of fabricating a semiconductor device according to 1, further comprising:
implanting an impurity into the bottom surfaces of the first and second trenches after formation of the first, second and third trenches, thereby forming high impurity concentration regions.

3. The method of fabricating a semiconductor device according to 2, wherein the forming of the high impurity concentration regions comprises:
implanting the impurity having the same conductivity type as that of the first well into the bottom surface of the first trench; and
implanting the impurity having the same conductivity type as that of the second well into the bottom surface of the second trench.

4. The method of fabricating a semiconductor device according to 1, further comprising:
forming a film, which is hard to react with a metal, on each of sidewalls of the first and second trenches before the forming of the silicide layer.

5. The method of fabricating a semiconductor device according to 4, wherein the forming of a film which is hard to react with a metal is the forming of an oxide film or nitride film on each of the sidewalls of the first and second trenches.

6. The method of fabricating a semiconductor device according to 4, wherein the forming of a film which is hard to react with a metal comprises:
forming the film, which is hard to react with a metal, inside each of the first and second trenches; and
removing the film, which is hard to react with a metal, other than the film formed on each of the sidewalls of the first and second trenches.

7. The method of fabricating a semiconductor device according to 1, wherein the forming of the first and second trenches comprises:
performing anisotropic etching by using a mask having a predetermined pattern, thereby patterning the semiconductor substrate; and
making a width of each of openings of the first and second trenches wider than that of each of openings of the predetermined pattern by performing the anisotropic etching.

8. The method of fabricating a semiconductor device according to 7, further comprising:
depositing a metallic film from each of outsides of the first and second trenches after making a width of each of the openings of the first and second trenches wider than that of each of the openings of the predetermined pattern, thereby depositing the metallic film on each of bottom surfaces, and lower sides of the inner side surface of the first and second trenches.

9. The method of fabricating a semiconductor device according to 8, wherein the depositing of the metallic film is performed by utilizing a sputtering method.

10. The method of fabricating a semiconductor device according to 1, wherein the silicide layer is formed so as not to contact each of source/drain regions formed in the first and second element regions.

11. A semiconductor device, comprising:
a semiconductor substrate;
first and second wells, having different conductivity types and respectively having first and second well contact connection regions, formed in the semiconductor substrate;
first and second transistors respectively formed on the first and second wells;
first, second and third isolation regions respectively formed in a region between the first transistor and the first well contact connection region on the first well, a region between the second transistor and the second well contact connection region on the second well, and a region between the first transistor and the second transistor; and
silicide layers formed in only first and second regions among the first and second regions and a third region, the first region being between a bottom surface of the first isolation region and the semiconductor substrate, and the second region being between a bottom surface of the second isolation region and the semiconductor substrate, the third region being between a bottom surface of the third isolation region and the semiconductor substrate.

12. The semiconductor device according to claim 11, wherein the semiconductor substrate has first and second high impurity concentration regions, the first high impurity concentration region having the same conductivity type as that of the first well in the bottom surface of the first isolation region, and the second high impurity concentration region having the same conductivity type as that of the second well in the bottom surface of the second isolation region.

13. The method of fabricating a semiconductor device according to 1, further comprising:
respectively implanting first and second impurities into the bottom surfaces of the first and second trenches after formation of the first, second and third trenches, thereby forming high impurity concentration regions.

14. The method of fabricating a semiconductor device according to 13, wherein the first impurity has the same conductivity type as that of the first well, and the second impurity has the same conductivity type as that of the second well.

15. The method of claim 1, wherein said simultaneously forming silicide layer on bottom surfaces of the first and second trenches comprises forming low-resistance silicide layers.

16. The semiconductor device of claim 11, wherein the silicide layers form low-resistance portions.

* * * * *